United States Patent
Lin

(10) Patent No.: US 9,572,244 B1
(45) Date of Patent: Feb. 14, 2017

(54) LATCH DEVICE FOR HEAT DISSIPATION COMPONENT

(71) Applicant: ASIA VITAL COMPONENTS CO., LTD., New Taipei (TW)

(72) Inventor: Sheng-Huang Lin, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 0 days.

(21) Appl. No.: 14/882,390

(22) Filed: Oct. 13, 2015

(51) Int. Cl.
*H05K 1/02* (2006.01)

(52) U.S. Cl.
CPC ....... *H05K 1/0203* (2013.01); *H05K 2201/066* (2013.01); *H05K 2201/10598* (2013.01)

(58) Field of Classification Search
CPC .............. H05K 1/0203; H05K 2201/10598; H05K 2201/066
USPC .......................... 361/707–723; 165/80.3, 185
See application file for complete search history.

(56) References Cited

U.S. PATENT DOCUMENTS

| | | | |
|---|---|---|---|
| 2005/0201064 A1* | 9/2005 | Chen | H01L 23/4093 361/719 |
| 2008/0273309 A1* | 11/2008 | Lin | H01L 23/4093 361/718 |
| 2009/0217496 A1* | 9/2009 | Lin | H01L 23/4093 24/485 |
| 2011/0155408 A1* | 6/2011 | Li | B65H 75/48 174/50 |
| 2014/0352919 A1* | 12/2014 | Lin | H01L 23/4093 165/76 |
| 2015/0296654 A1* | 10/2015 | Lin | H05K 7/2039 361/709 |
| 2015/0296663 A1* | 10/2015 | Lin | F28F 99/00 165/185 |

* cited by examiner

*Primary Examiner* — Anthony Haughton
*Assistant Examiner* — Yahya Ahmad

(57) ABSTRACT

A latch device for heat dissipation component includes a main body, a first and a second elastic member, a first and a second rotary unit. Two sides of the main body are respectively formed with a first and a second perforation. The first and second elastic members are fixedly disposed on one face of a motherboard. A first and a second hook/latch section respectively protrude from the first and the second elastic members corresponding to the first and second perforations. By means of a first and a second hook/latch member, the first and second rotary units are correspondingly hooked/latch with the first and second hook/latch sections. Then, the first and second rotary units are rotated to pull upward the first and second hook/latch members; further the first and second hook/latch sections can fix the main body. Hence, a user can assemble/detach the main body without using any hand tool.

14 Claims, 9 Drawing Sheets

LATCH DEVICE FOR HEAT DISSIPATION COMPONENT

BACKGROUND OF THE INVENTION

1. Field of the Invention

The present invention relates generally to a latch device for heat dissipation component, and more particularly to a latch device for heat dissipation component, with which an operator can directly barehanded install the heat dissipation component on a motherboard or detach the heat dissipation component from the motherboard without using any tool.

2. Description of the Related Art

An electronic apparatus includes numerous electronic components. In operation and calculation, the electronic components will generate heat. When the heat generated by the electronic components exceeds a limit, the processing efficiency of the electronic apparatus will be affected or even the lifetime of the electronic apparatus will be shortened. Therefore, various heat dissipation components such as heat sinks, radiating fins, heat pipes and vapor chambers are often used to conduct and dissipate the heat of the electronic apparatus. These heat dissipation components cannot be directly fixed with the electronic components and it is necessary to use a latch device, a latch member or a holding device to fix the heat dissipation components on the electronic components to dissipate the heat.

The heat sinks and radiating fins mainly serve to increase the heat dissipation area so as to quickly conduct the heat generated by the electronic components and dissipate the heat and avoid accumulation of the heat. The heat pipe is mainly used for remote end heat dissipation. The heat pipe is able to conduct the heat generated by the electronic components to a remote place far away from the electronic components to dissipate the heat. Therefore, the heat generated by the electronic components is prevented from accumulating at the center of the electronic apparatus. The vapor chamber serves to face-to-face conduct the heat by large area. The vapor chamber is mainly disposed between a heat source and the heat dissipation component to enhance the heat conduction efficiency therebetween. All the above heat dissipation components necessitate the latch device, latch member or holding device to be fixedly mounted on the electronic component. In general, the heat sink is fixedly connected with the electronic component by means of screws, which must be tightened or untightened with a tool. In the case that an operator has no tool at hand, it is impossible for the operator to tighten or untighten the screws. Therefore, it is quite inconvenient to install/detach the heat sink.

It is therefore tried by the applicant to provide a latch device for heat dissipation component. With the latch device, an operator can directly barehanded install the heat dissipation component on a motherboard or detach the heat dissipation component from the motherboard without using any tool.

SUMMARY OF THE INVENTION

It is therefore a primary object of the present invention to provide a latch device for heat dissipation component. By means of the latch device, an operator can directly barehanded install the heat dissipation component on a motherboard or detach the heat dissipation component from the motherboard without using any tool.

To achieve the above and other objects, the latch device for heat dissipation component of the present invention includes a heat sink main body, a first elastic member, a second elastic member, a first rotary unit and a second rotary unit.

The left and right sides of the heat sink main body are respectively formed with a first perforation and a second perforation. The first and second elastic members are fixedly disposed on one face of a motherboard. A first hook/latch section and a second hook/latch section respectively protrude from the first and the second elastic members corresponding to the first and second perforations of the heat sink main body. The first rotary unit has a first spiral slot, a second spiral slot and a first shaft hole in which a first pivotal member is pivotally disposed. A first hook/latch member is inserted in and connected with the first pivotal member. One end of the first hook/latch member is correspondingly hooked/latched with the first hook/latch section. A first shaft rod is pivotally connected with the other end of the first hook/latch member. Two ends of the first shaft rod are respectively inlaid in the first and second spiral slots to bridge the first shaft rod between the first and second spiral slots. The second rotary unit has a third spiral slot, a fourth spiral slot and a second shaft hole in which a second pivotal member is pivotally disposed. A second hook/latch member is inserted in and connected with the second pivotal member. One end of the second hook/latch member is correspondingly hooked/latched with the second hook/latch section. A second shaft rod is pivotally connected with the other end of the second hook/latch member. Two ends of the second shaft rod are respectively inlaid in the third and fourth spiral slots to bridge the second shaft rod between the third and fourth spiral slots.

In operation, the first and second rotary units are rotated. At this time, the first and second spiral slots and the third and fourth spiral slots formed on the first and second rotary units urge the first and second shaft rods to move within the first, second, third and fourth spiral slots. Under such circumstance, the first and second hook/latch members are axially moved to pull the first and second hook/latch sections upward or release the first and second hook/latch sections so as to elastically deform the first and second elastic members and make the heat sink main body tightly attach to the electronic component. By means of the first and second rotary units of the present invention, an operator can barehanded assemble/detach the heat sink main body without using any hand tool.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
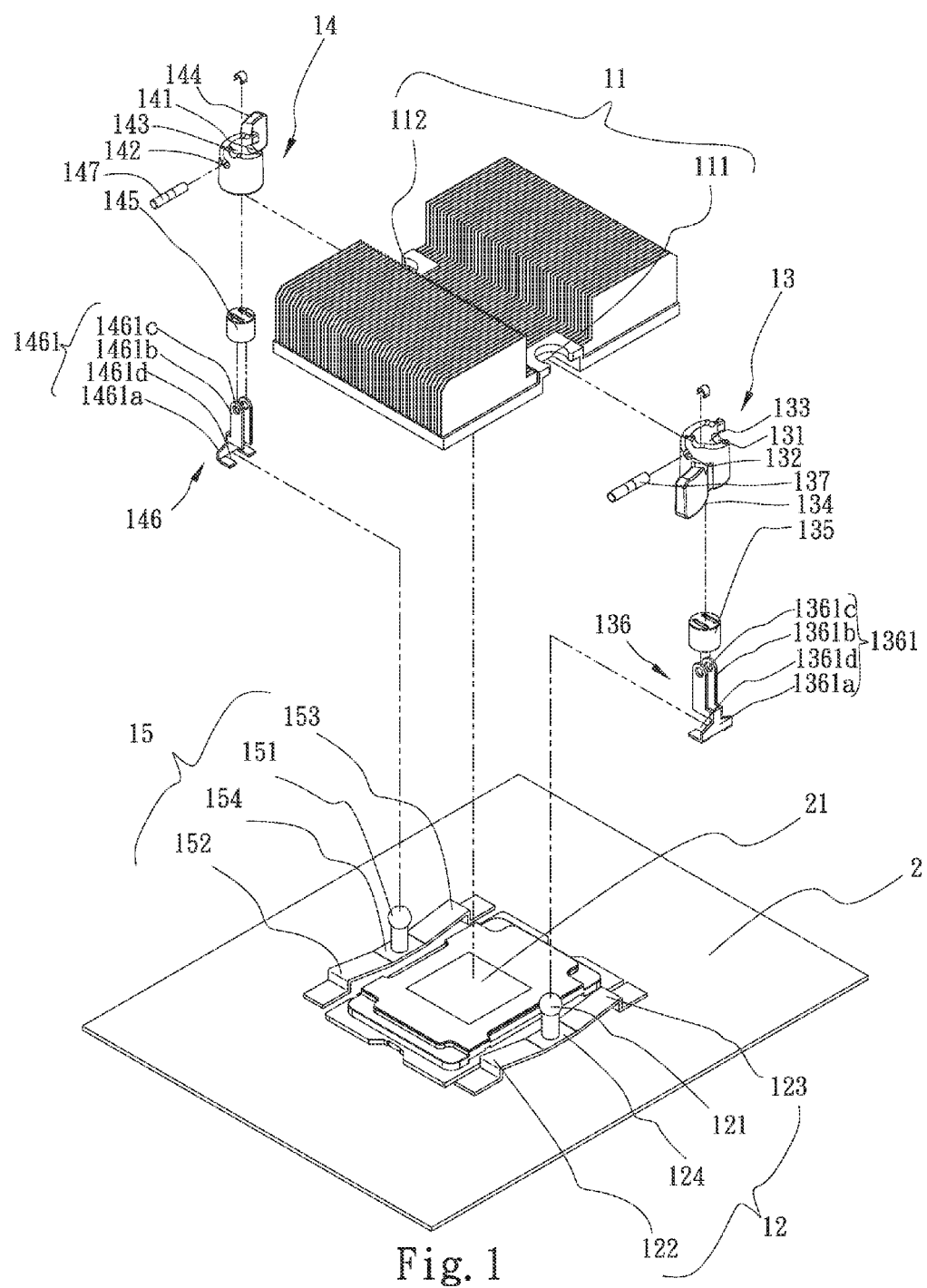
FIG. 1 is a perspective exploded view of a first embodiment of the latch device for heat dissipation component of the present invention.
Figure 2:
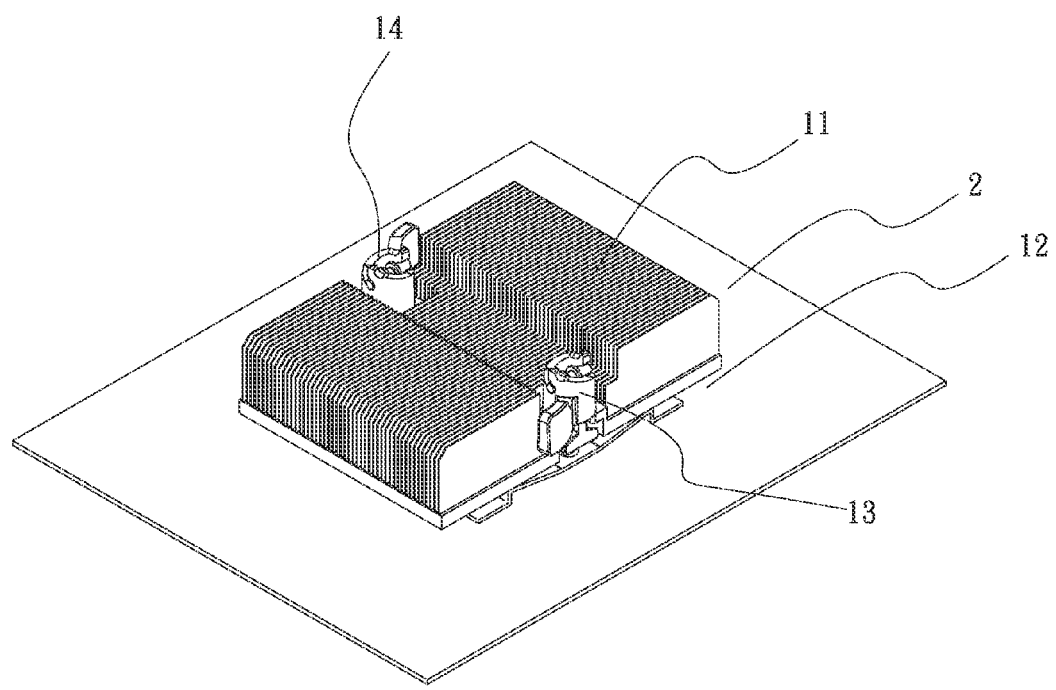
FIG. 2 is a perspective assembled view of the first embodiment of the latch device for heat dissipation component of the present invention.
Figure 3:
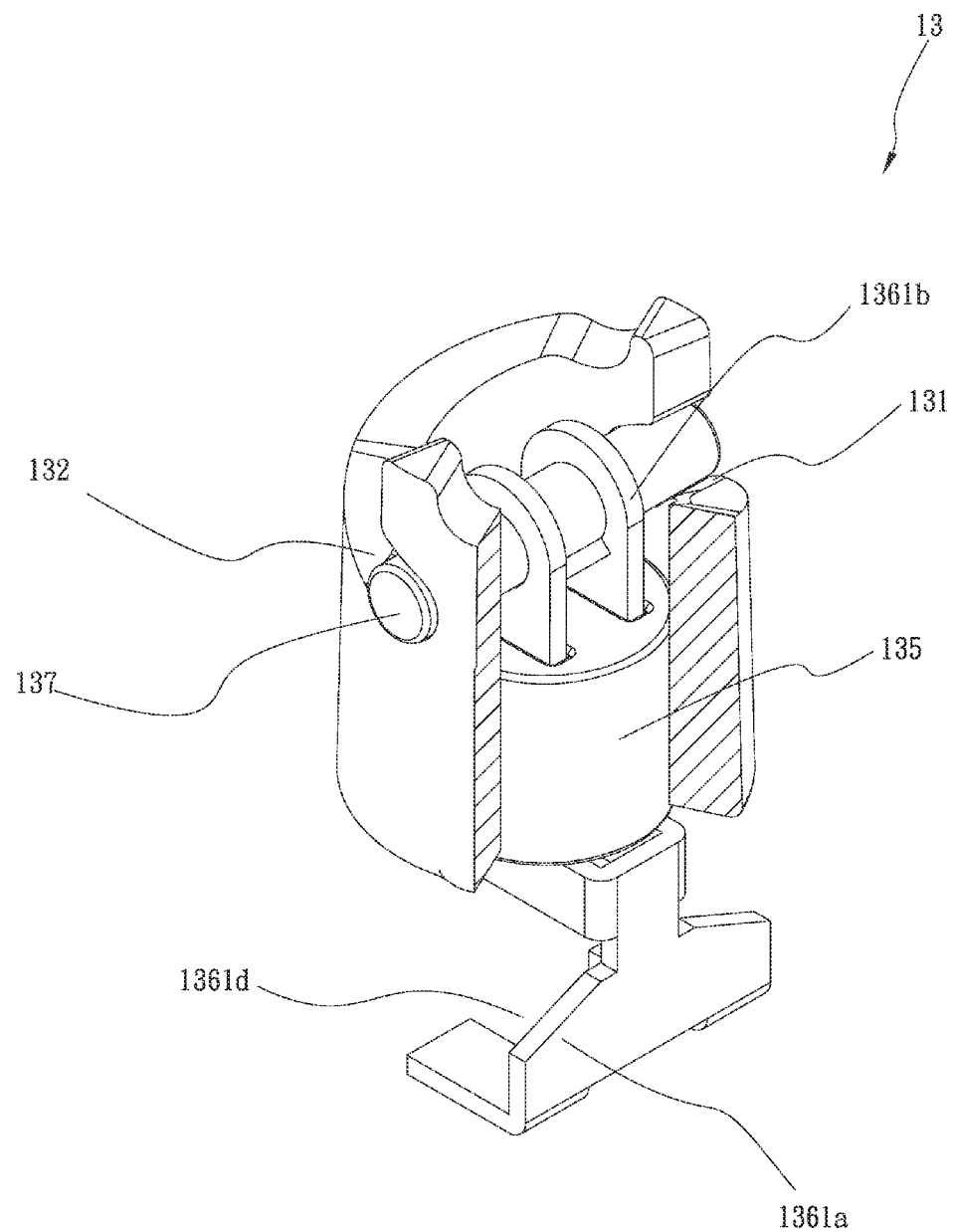
FIG. 3 is a perspective sectional view of the first rotary unit of the latch device for heat dissipation component of the present invention.

Please refer to FIGS. 1, 2 and 3. FIG. 1 is a perspective exploded view of a first embodiment of the latch device for heat dissipation component of the present invention. FIG. 2 is a perspective assembled view of the first embodiment of the latch device for heat dissipation component of the present invention. FIG. 3 is a perspective sectional view of the first rotary unit of the latch device for heat dissipation component of the present invention. According to the first embodiment, the latch device for heat dissipation component of the present invention includes a heat sink main body 11, a first elastic member 12, a second elastic member 15, a first rotary unit 13 and a second rotary unit 14.

The heat sink main body 11 has a left side and a right side. The left and right sides of the heat sink main body 11 are respectively formed with a first perforation 111 and a second perforation 112. The first and second perforations 111, 112 pass through the heat sink between upper face and lower face of the heat sink.

At least one first hook/latch section 121 protrudes from the first elastic member 12 corresponding to the first perforation 111 of the heat sink main body 11. At least one second hook/latch section 151 protrudes from the second elastic member 15 corresponding to the second perforation 112 of the heat sink main body 11. The first and second elastic members 12, 15 are fixedly disposed on one face of a motherboard 2. The heat sink main body 11 can be fixed in a position where the first and second elastic members 12, 15 are disposed. The first elastic member 12 is M-shaped and has a first connection end 122, a second connection end 123 and a first middle portion 124. The first middle portion 124 is positioned between the first and second connection ends 122, 123 and the first and second connection ends 122, 123 are connected with the motherboard 2. The first hook/latch section 121 is perpendicularly disposed on the first middle portion 124. The second elastic member 15 is M-shaped and has a third connection end 152, a fourth connection end 153 and a second middle portion 154. The second middle portion 154 is positioned between the third and fourth connection ends 152, 153 and the third and fourth connection ends 152, 153 are connected with the motherboard 2. The second hook/latch section 151 is perpendicularly disposed on the second middle portion 154.

The first rotary unit 13 has a first spiral slot 131, a second spiral slot 132, a first shaft hole 133 and a first shift plate 134. A first pivotal member 135 is pivotally disposed in the first shaft hole 133. In addition, a first hook/latch member 136 is inserted in and connected with the first pivotal member 135. One end of the first hook/latch member 136 is correspondingly hooked/latched with the first hook/latch section 121. A first shaft rod 137 is pivotally connected with the other end of the first hook/latch member 136. Two ends of the first shaft rod 137 are respectively inlaid in the first and second spiral slots 131, 132 to bridge the first shaft rod 137 between the first and second spiral slots 131, 132. The first and second spiral slots 131, 132 are formed on lateral sides of the first rotary unit 13 in reverse directions. The first shift plate 134 is selectively disposed at an upper end of the first rotary unit 13 or disposed on a lateral side thereof. In this embodiment, the first shift plate 134 is, but not limited to, disposed on a lateral side of the first rotary unit 13 for illustration purposes.

The first hook/latch member 136 has a first main body 1361. Two ends of the first main body 1361 are respectively a first hook end 1361a and a first extension end 1361b. The first extension end 1361b is extended through the first pivotal member 135 and inserted in the first pivotal member 135 and connected therewith. The first extension end 1361b has a first hole 1361c. The first shaft rod 137 is inserted in the first hole 1361c. The first hook end 1361a has a first notch 1361d. The first hook/latch section 121 has a free end. The free end of the first hook/latch section 121 has a diameter larger than that of any other portion of the first hook/latch section 121. The free end of the first hook/latch section 121 is hooked/latched in the first notch 1361d.

The second rotary unit 14 has a third spiral slot 141, a fourth spiral slot 142, a second shaft hole 143 and a second shift plate 144. A second pivotal member 145 is pivotally disposed in the second shaft hole 143. In addition, a second hook/latch member 146 is inserted in and connected with the second pivotal member 145. One end of the second hook/latch member 146 is correspondingly hooked/latched with the second hook/latch section 151. A second shaft rod 147 is pivotally connected with the other end of the second hook/latch member 146. Two ends of the second shaft rod 147 are respectively inlaid in the third and fourth spiral slots 141, 142 to bridge the second shaft rod 147 between the third and fourth spiral slots 141, 142. The third and fourth spiral slots 141, 142 are formed on lateral sides of the second rotary unit 14 in reverse directions. The second shift plate 144 is selectively disposed at an upper end of the second rotary unit 14 or disposed on a lateral side thereof. In this embodiment, the second shift plate 144 is, but not limited to, disposed on a lateral side of the second rotary unit 14 for illustration purposes.

The second hook/latch member 146 has a second main body 1461. Two ends of the second main body 1461 are respectively a second hook end 1461a and a second extension end 1461b. The second extension end 1461b is extended through the second pivotal member 145 and inserted in the second pivotal member 145 and connected therewith. The second extension end 1461b has a second hole 1461c. The second shaft rod 147 is inserted in the second hole 1461c. The second hook end 1461a has a second notch 1461d. The second hook/latch section 151 has a free end. The free end of the second hook/latch section 151 has a diameter larger than that of any other portion of the second hook/latch section 151. The free end of the second hook/latch section 151 is hooked/latched in the second notch 1461d.

Figure 4:
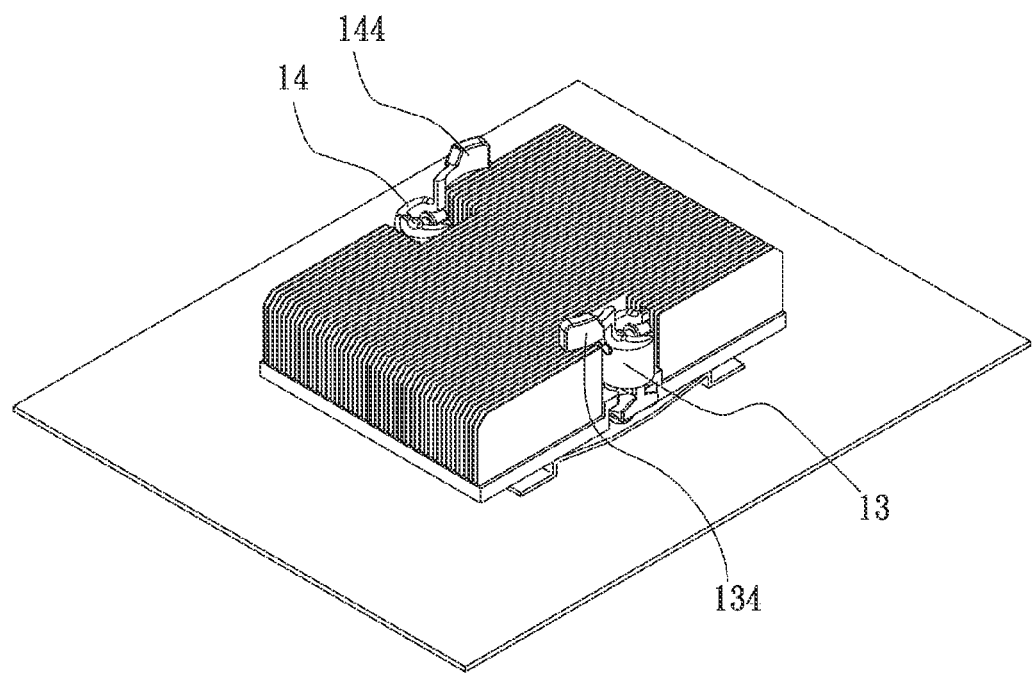
FIG. 4 is a perspective view of the first and second rotary units of the latch device for heat dissipation component of the present invention in another aspect.

Please now refer to FIG. 4, which is a perspective view of the first and second rotary units of the latch device for heat dissipation component of the present invention in another aspect. This aspect is partially identical to the above aspect in structure and thus will not be repeatedly described hereinafter. This aspect is different from the above aspect in that the first shift plate 134 is disposed at the upper end of the first rotary unit 13 and the second shift plate 144 is disposed at the upper end of the second rotary unit 14.

Figure 5:
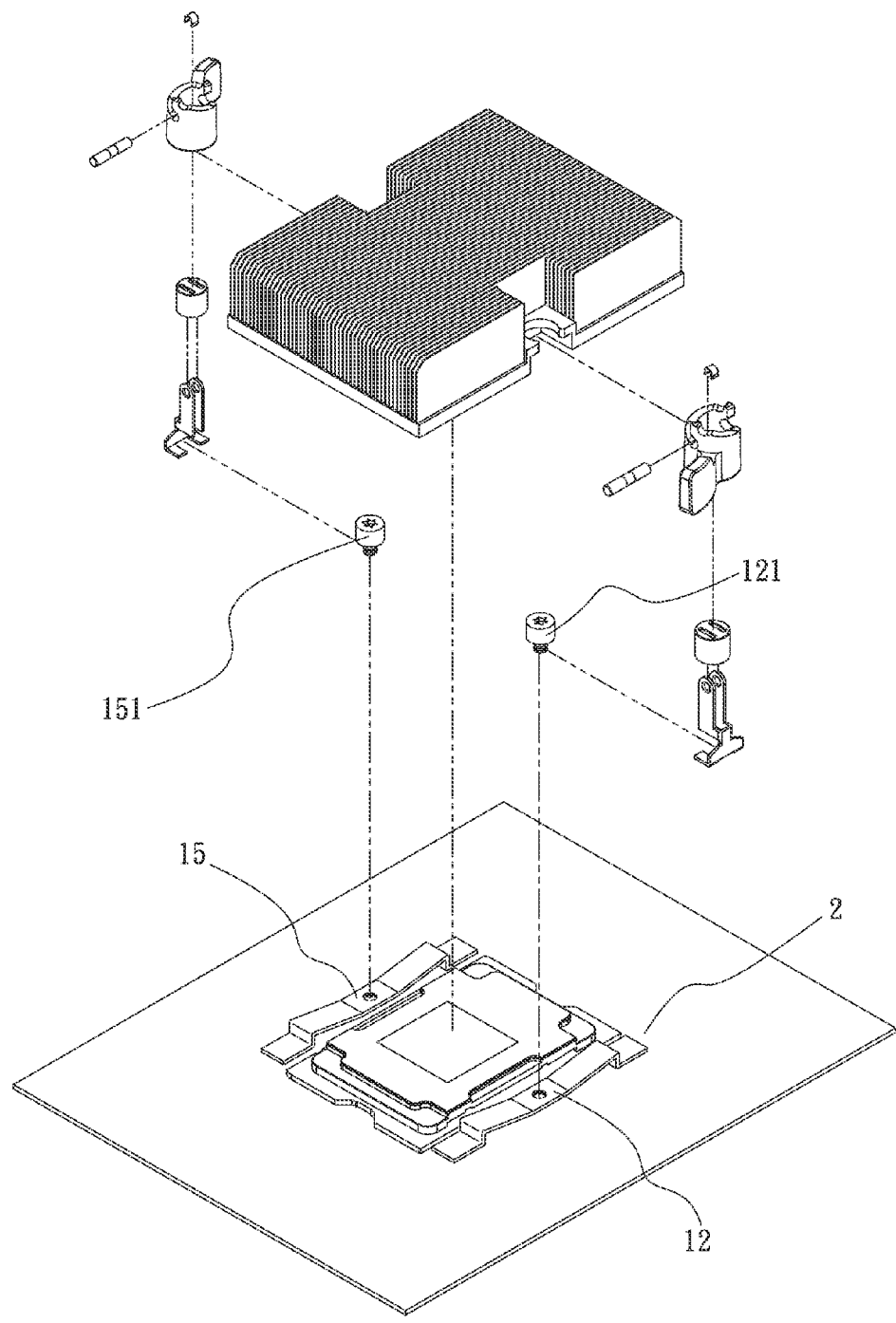
FIG. 5 is a perspective exploded view of a second embodiment of the latch device for heat dissipation component of the present invention.

Please now refer to FIG. 5, which is a perspective exploded view of a second embodiment of the latch device for heat dissipation component of the present invention. The second embodiment is partially identical to the first embodiment in structure and thus will not be repeatedly described hereinafter. The second embodiment is different from the first embodiment in that the first and second hook/latch sections 121, 151 are bolts each having a threaded end. The threaded ends of the bolts are screwed on one face of the first elastic member 12 and one face of the second elastic member 15.

Figure 6:
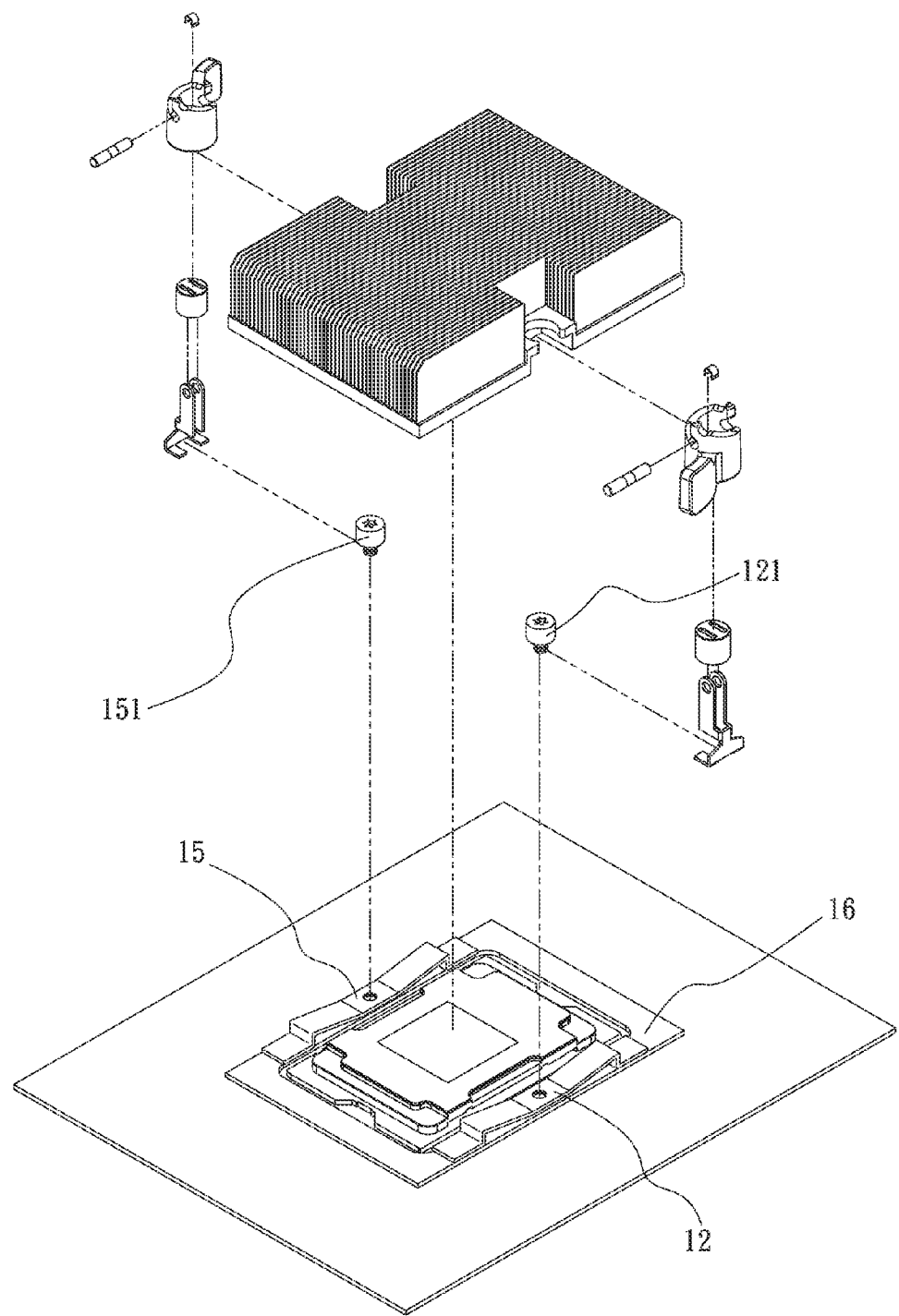
FIG. 6 is a perspective exploded view of a third embodiment of the latch device for heat dissipation component of the present invention.

Please now refer to FIG. 6, which is a perspective exploded view of a third embodiment of the latch device for heat dissipation component of the present invention. The third embodiment is partially identical to the second embodiment in structure and thus will not be repeatedly described hereinafter. The third embodiment is different from the second embodiment in that the latch device further includes a fixing member 16 correspondingly disposed on one face of the motherboard 2. The first and second elastic members 12, 15 are oppositely disposed on the left and right sides of the fixing member 16.

Figure 7:
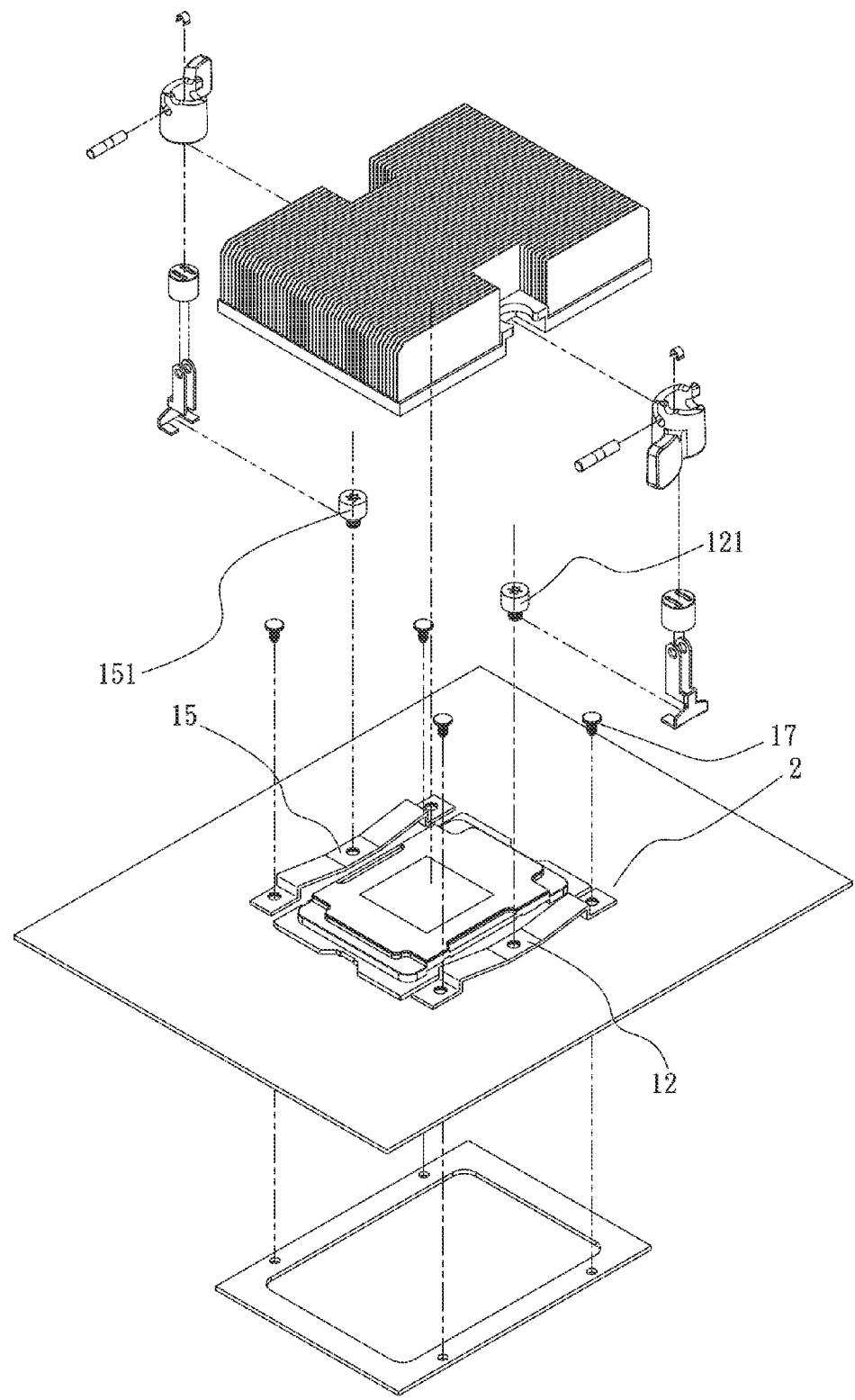
FIG. 7 is a perspective exploded view of a fourth embodiment of the latch device for heat dissipation component of the present invention.

Please now refer to FIG. 7, which is a perspective exploded view of a fourth embodiment of the latch device for heat dissipation component of the present invention. The fourth embodiment is partially identical to the third embodiment in structure and thus will not be repeatedly described hereinafter. The fourth embodiment is different from the third embodiment in that the fixing member 16 is correspondingly disposed on the other face of the motherboard 2 distal from the first and second elastic members 12, 15. The fixing member 16 is aligned with the first and second elastic members 12, 15. Screws 17 are screwed through the first and second elastic members 12, 15, the motherboard 2 and the fixing member 16 to lock the fixing member 16 with the motherboard 2. Accordingly, the structural strength of the motherboard 2 is enhanced.

Figure 8:
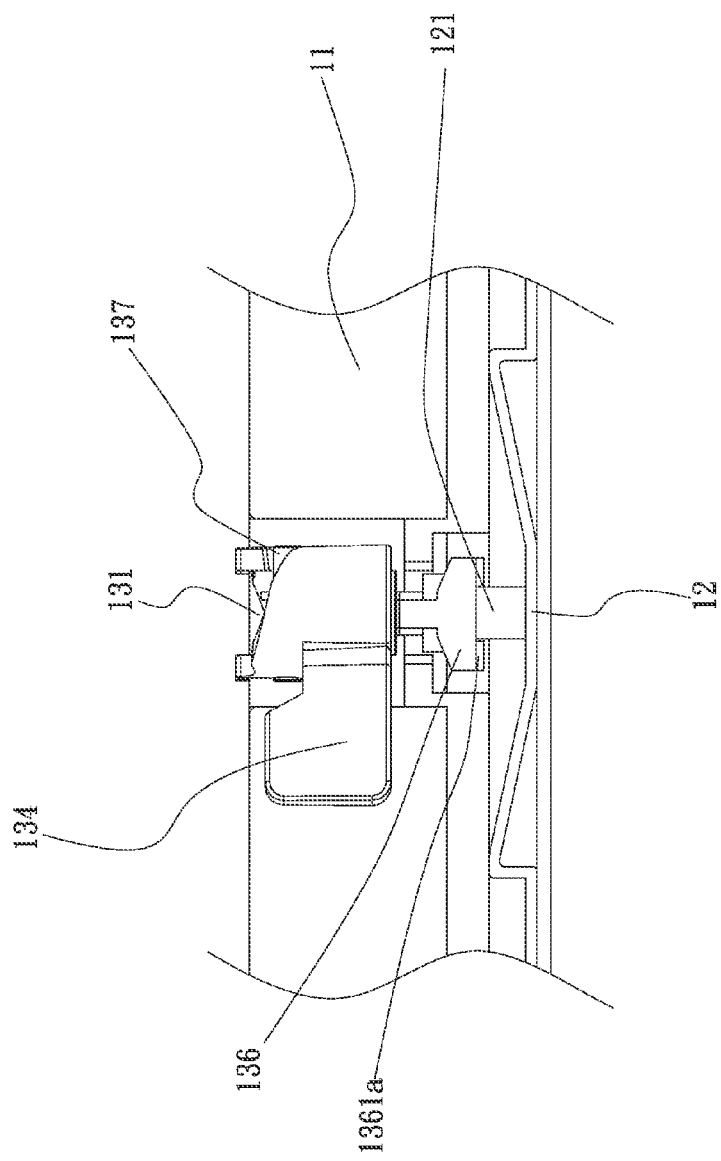
FIG. 8 is a side view of the latch device for heat dissipation component of the present invention, showing the operation thereof.
Figure 9:
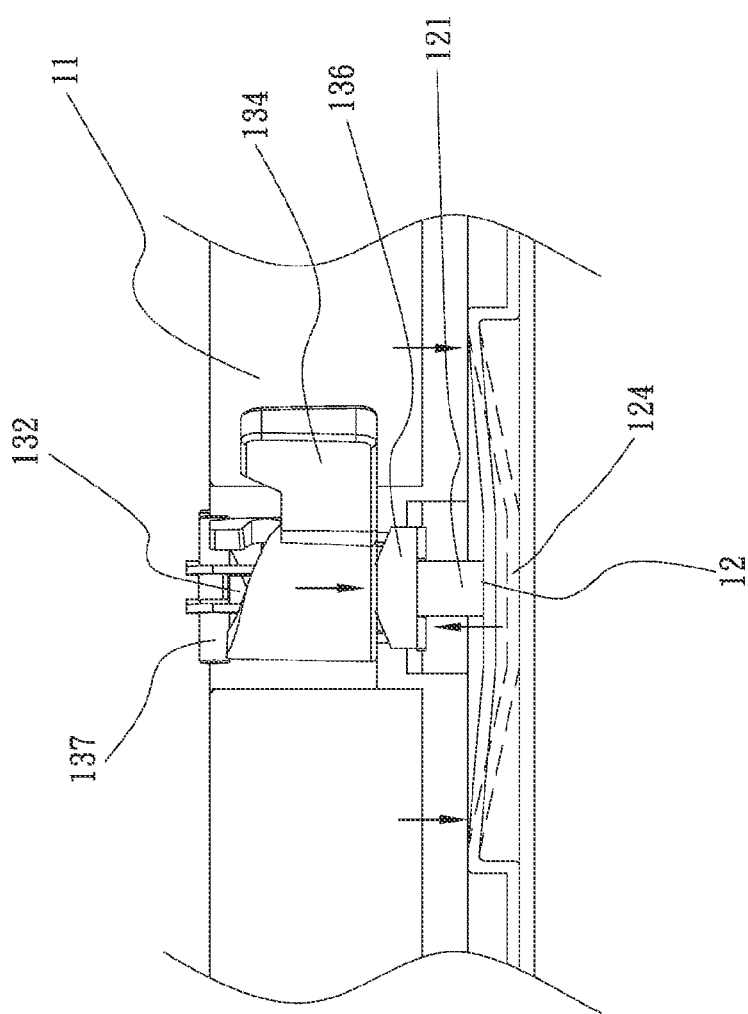
FIG. 9 is a side view of the latch device for heat dissipation component of the present invention, showing the operation thereof.

Please now refer to FIGS. 8 and 9. FIG. 8 is a side view of the latch device for heat dissipation component of the present invention, showing the operation thereof. FIG. 9 is a side view of the latch device for heat dissipation component of the present invention, showing the operation thereof. Please also refer to FIGS. 1 to 7. The first and second elastic members 12, 15 are disposed on one face of the motherboard 2 in adjacency to the electronic component 21 as a heat source. The first and second elastic members 12, 15 mainly serve to fix the heat sink main body 11 and make the heat sink main body 11 attach to the electronic component 21 for conducting the heat. In operation, the first and second perforations 111, 112 of the heat sink main body 11 are first aligned with the first and second hook/latch sections 121, 151 of the first and second elastic members 12, 15. Then, the first and second hook/latch members 136, 146 of the first and second rotary units 13, 14 are hooked/latched with the first and second hook/latch sections 121, 151. Then, the first and second shift plates 134, 144 of the first and second rotary units 13, 14 are operated and shifted to rotate the first and second rotary units 13, 14. At this time, the first and second spiral slots 131, 132 and the third and fourth spiral slots 141, 142 formed on the first and second rotary units 13, 14 urge the first and second shaft rods 137, 147 bridged therebetween to slide and move within the first, second, third and fourth spiral slots 131, 132, 141, 142. Under such circumstance, the first and second hook/latch members 136, 146 are driven and pulled upward. Simultaneously, the first and second hook/latch members 136, 146 pull the first and second hook/latch sections 121, 151 upward to elastically deform the first and second elastic members 12, 15. The first and second middle portions 124, 154 are pulled upward by the first and second hook/latch sections 121, 151. When the first and second hook/latch members 136, 146 are pulled upward, the first and second hook ends 1361a, 1461a of the front ends of the first and second hook/latch members 136, 146 pull the first and second hook/latch sections 121, 151 upward. At this time, the first and second elastic members 12, 15 are elastically deformed to apply an elastic restoring force to the first and second hook/latch members 136, 146 and pull the first and second hook/latch members 136, 146 in a reverse direction. At this time, the first and second shaft rods 137, 147 at the extension ends of the first and second hook/latch members 136, 146 press the first and second rotary units 13, 14 to downward press the left and right sides of the heat sink main body 11, where the first and second perforations 111, 112 are formed. Accordingly, the heat sink main body 11 is fixedly disposed on the first and second elastic members 12, 15 and tightly attached to the electronic component 21 for conducting the heat. By means of the first and second rotary units 13, 14 of the present invention, a user or an assembling worker in the production line can barehanded assemble/detach the heat sink main body without using any hand tool.

The present invention has been described with the above embodiments thereof and it is understood that many changes and modifications in the above embodiments can be carried out without departing from the scope and the spirit of the invention that is intended to be limited only by the appended claims.

What is claimed is:

1. A latch device for heat dissipation component, comprising:

a heat sink main body having a left side and a right side, the left and right sides of the heat sink main body being respectively formed with a first perforation and a second perforation;

a first elastic member, at least one first hook/latch section protruding from the first elastic member corresponding to the first perforation of the heat sink main body, the first elastic member being fixedly disposed on one face of a motherboard;

a second elastic member, at least one second hook/latch section protruding from the second elastic member corresponding to the second perforation of the heat sink main body, the second elastic member being also fixedly disposed on the face of the motherboard;

a first rotary unit having a first spiral slot, a second spiral slot and a first shaft hole, a first pivotal member being pivotally disposed in the first shaft hole, a first hook/latch member being inserted in and connected with the first pivotal member, one end of the first hook/latch member being correspondingly hooked/latched with the first hook/latch section, a first shaft rod being pivotally connected with the other end of the first hook/latch member, two ends of the first shaft rod being respectively inlaid in the first and second spiral slots to bridge the first shaft rod between the first and second spiral slots; and a second rotary unit having a third spiral slot, a fourth spiral slot and a second shaft hole, a second pivotal member being pivotally disposed in the second shaft hole, a second hook/latch member being inserted in and connected with the second pivotal member, one end of the second hook/latch member being correspondingly hooked/latched with the second hook/latch section, a second shaft rod being pivotally connected with the other end of the second hook/latch member, two ends of the second shaft rod being respectively inlaid in the third and fourth spiral slots to bridge the second shaft rod between the third and fourth spiral slots.

2. The latch device for heat dissipation component as claimed in claim 1, further comprising a fixing member corresponding to the first and second elastic members, the fixing member being fixedly disposed on the same face of the motherboard as the first and second elastic members or on the other face of the motherboard opposite to the first and second elastic members.

3. The latch device for heat dissipation component as claimed in claim 1, wherein the first rotary unit further has a first shift plate, the first shift plate being selectively disposed at an upper end of the first rotary unit or disposed on a lateral side thereof.

4. The latch device for heat dissipation component as claimed in claim 1, wherein the first and second spiral slots are formed on lateral sides of the first rotary unit in reverse directions.

5. The latch device for heat dissipation component as claimed in claim 1, wherein the first hook/latch member has a first main body, two ends of the first main body being respectively a first hook end and a first extension end, the first extension end being extended through the first pivotal member and inserted in the first pivotal member and connected therewith.

6. The latch device for heat dissipation component as claimed in claim 1, wherein the first extension end has a first hole, the first shaft rod being inserted in the first hole.

7. The latch device for heat dissipation component as claimed in claim 1, wherein the second rotary unit further has a second shift plate, the second shift plate being selectively disposed at an upper end of the second rotary unit or disposed on a lateral side thereof.

8. The latch device for heat dissipation component as claimed in claim 1, wherein the third and fourth spiral slots are formed on lateral sides of the second rotary unit in reverse directions.

9. The latch device for heat dissipation component as claimed in claim 1, wherein the second hook/latch member has a second main body, two ends of the second main body being respectively a second hook end and a second extension end, the second extension end being extended through the second pivotal member and inserted in the second pivotal member and connected therewith, the second extension end having a second hole, the second shaft rod being inserted in the second hole.

10. The latch device for heat dissipation component as claimed in claim 1, wherein the first hook end has a first notch and the second hook end has a second notch.

11. The latch device for heat dissipation component as claimed in claim 5, wherein the first hook/latch section has a free end, the free end of the first hook/latch section having a diameter larger than that of any other portion of the first hook/latch section, the free end of the first hook/latch section being hooked/latched in the first notch.

12. The latch device for heat dissipation component as claimed in claim 9, wherein the second hook/latch section has a free end, the free end of the second hook/latch section having a diameter larger than that of any other portion of the second hook/latch section, the free end of the second hook/latch section being hooked/latched in the second notch.

13. The latch device for heat dissipation component as claimed in claim 1, wherein the first and second hook/latch sections are bolts.

14. The latch device for heat dissipation component as claimed in claim 1, wherein the first elastic member is M-shaped and has a first connection end, a second connection end and a first middle portion, the first middle portion being positioned between the first and second connection ends, the first and second connection ends being connected with one face of the motherboard, the first hook/latch section being perpendicularly disposed on the first middle portion, the second elastic member being M-shaped and having a third connection end, a fourth connection end and a second middle portion, the second middle portion being positioned between the third and fourth connection ends, the third and fourth connection ends being connected with the face of the motherboard, the second hook/latch section being perpendicularly disposed on the second middle portion.

* * * * *